(12) United States Patent
Chen et al.

(10) Patent No.: US 9,553,066 B2
(45) Date of Patent: Jan. 24, 2017

(54) POST PASSIVATION INTERCONNECT STRUCTURES AND METHODS FOR FORMING THE SAME

(71) Applicant: Taiwan Semiconductor Manufacturing Company, Ltd., Hsin-Chu (TW)

(72) Inventors: Hsien-Wei Chen, Hsin-Chu (TW); Ying-Ju Chen, Tuku Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/603,881

(22) Filed: Jan. 23, 2015

(65) Prior Publication Data

US 2015/0130057 A1 May 14, 2015

Related U.S. Application Data

(62) Division of application No. 13/618,382, filed on Sep. 14, 2012, now Pat. No. 8,952,530.

(51) Int. Cl.
*H01L 23/00* (2006.01)
*H01L 23/528* (2006.01)
(Continued)

(52) U.S. Cl.
CPC ............. *H01L 24/14* (2013.01); *H01L 23/293* (2013.01); *H01L 23/3171* (2013.01); *H01L 23/3192* (2013.01); *H01L 23/528* (2013.01); *H01L 23/5226* (2013.01); *H01L 24/05* (2013.01); *H01L 24/06* (2013.01); *H01L 23/525* (2013.01); *H01L 24/03* (2013.01); *H01L 24/11* (2013.01); *H01L 24/13* (2013.01); *H01L 2224/02351* (2013.01); *H01L 2224/02375* (2013.01); *H01L 2224/0401* (2013.01); *H01L 2224/05008* (2013.01); *H01L 2224/05022* (2013.01); *H01L 2224/05025* (2013.01); *H01L 2224/05147* (2013.01); *H01L 2224/05166* (2013.01); *H01L 2224/05186* (2013.01); *H01L 2224/05569* (2013.01); *H01L 2224/1146* (2013.01); *H01L 2224/11849* (2013.01); *H01L 2224/131* (2013.01); *H01L 2224/13027* (2013.01); *H01L 2224/13082* (2013.01);
(Continued)

(58) Field of Classification Search
None
See application file for complete search history.

(56) References Cited

U.S. PATENT DOCUMENTS

| 6,218,281 B1 | 4/2001 | Watanabe et al. |
| 2004/0053483 A1* | 3/2004 | Nair .................... H01L 21/2885 438/540 |

(Continued)

*Primary Examiner* — Michael Lebentritt
*Assistant Examiner* — Jordan Klein
(74) *Attorney, Agent, or Firm* — Slater Matsil, LLP

(57) ABSTRACT

A device includes a metal pad, a passivation layer overlapping edge portions of the metal pad, and a first polymer layer over the passivation layer. A Post-Passivation-Interconnect (PPI) has a level portion overlying the first polymer layer, and a plug portion that has a top connected to the level portion. The plug portion extends into the first polymer layer. A bottom surface of the plug portion is in contact with a dielectric material. A second polymer layer is overlying the first polymer layer.

20 Claims, 9 Drawing Sheets

(51) Int. Cl.
   *H01L 23/522* (2006.01)
   *H01L 23/31* (2006.01)
   *H01L 23/29* (2006.01)
   *H01L 23/525* (2006.01)

(52) U.S. Cl.
   CPC ............ *H01L 2224/13147* (2013.01); *H01L 2224/13155* (2013.01); *H01L 2224/1412* (2013.01); *H01L 2924/014* (2013.01); *H01L 2924/06* (2013.01); *H01L 2924/14* (2013.01); *H01L 2924/35121* (2013.01)

(56) References Cited

U.S. PATENT DOCUMENTS

| | | | |
|---|---|---|---|
| 2004/0137660 A1* | 7/2004 | Murata | H01L 21/32051 438/106 |
| 2004/0245639 A1* | 12/2004 | Yao | H01L 21/76838 257/758 |
| 2006/0040491 A1* | 2/2006 | Lim | H01L 21/76802 438/637 |
| 2006/0291029 A1* | 12/2006 | Lin | H01L 21/2885 257/622 |
| 2007/0001301 A1 | 1/2007 | Wang | |
| 2007/0176292 A1 | 8/2007 | Chen et al. | |
| 2007/0287279 A1 | 12/2007 | Daubenspeck et al. | |
| 2008/0308934 A1* | 12/2008 | Alvarado | H01L 23/3171 257/738 |
| 2009/0194889 A1 | 8/2009 | Jeng et al. | |
| 2010/0001412 A1 | 1/2010 | Chang et al. | |
| 2010/0072624 A1* | 3/2010 | Liu | H01L 23/5226 257/763 |
| 2010/0244188 A1* | 9/2010 | Mihara | H01L 23/3114 257/531 |
| 2010/0283148 A1 | 11/2010 | Tsai et al. | |
| 2011/0018128 A1 | 1/2011 | Wei et al. | |
| 2011/0031618 A1 | 2/2011 | Yu et al. | |
| 2011/0115073 A1 | 5/2011 | Chen | |
| 2013/0026618 A1* | 1/2013 | Chen | H01L 23/525 257/737 |

\* cited by examiner

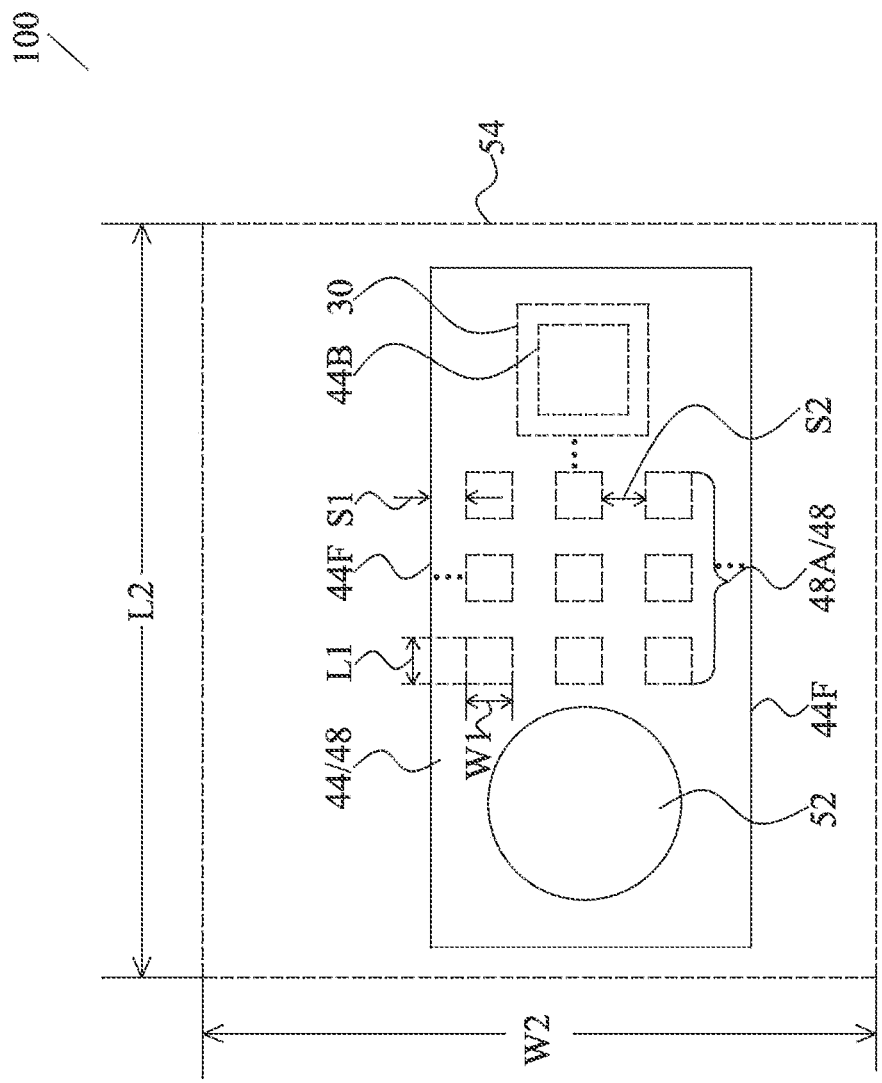

POST PASSIVATION INTERCONNECT STRUCTURES AND METHODS FOR FORMING THE SAME

PRIORITY CLAIM AND CROSS-REFERENCE

This application is a divisional of U.S. patent application Ser. No. 13/618,382, entitled "Post Passivation Interconnect Structures and Methods for Forming the Same," filed on Sep. 14, 2012, which application is incorporated herein by reference.

BACKGROUND

In the formation of a wafer-level chip scale package (WLCSP), integrated circuit devices such as transistors are first formed at the surface of a semiconductor substrate in a wafer. An interconnect structure is then formed over the integrated circuit devices. A metal pad is formed over, and is electrically coupled to, the interconnect structure. A passivation layer and a first polymer layer are formed on the metal pad, with the metal pad exposed through the openings in the passivation layer and the first polymer layer.

Post-passivation interconnect (PPI) is then formed, followed by the formation of a second polymer layer over the PPI. An Under-Bump-Metallurgy (UBM) is formed extending into an opening in the second polymer layer, wherein the UBM is electrically connected to the PPI. A solder ball is then placed over the UBM and reflowed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 4A are cross-sectional views of intermediate stages in the manufacturing of a wafer comprising a post-passivation interconnect structure in accordance with some exemplary embodiments;

FIGS. 5 through 7A are cross-sectional views of intermediate stages in the manufacturing of a wafer comprising a post-passivation interconnect structure in accordance with alternative embodiments; and FIG. 7B illustrates a top view of the structure shown in FIG. 7A.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A wafer comprising a Post-Passivation Interconnect (PPI) structure and the method of forming the same are provided in accordance with an embodiment. The intermediate stages of manufacturing various embodiments are illustrated. The variations of the embodiment are then discussed. Throughout the various views and illustrative embodiments, like reference numbers are used to designate like elements.

Figure 1:
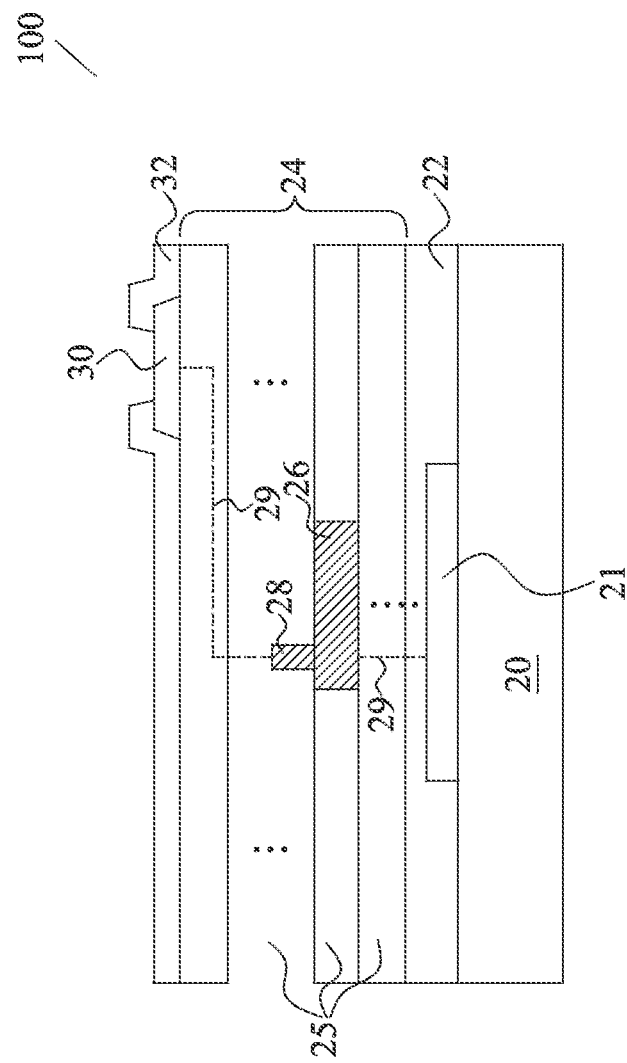

Referring to FIG. 1, wafer 100, which includes semiconductor substrate 20, is provided. Semiconductor substrate 20 may be a bulk silicon substrate or a silicon-on-insulator substrate. Alternatively, other semiconductor materials that include group III, group IV, and group V elements may also be used, which may include silicon germanium, silicon carbon, and III-V compound semiconductor materials. Integrated circuit devices such as transistors (schematically illustrated as 21) are formed in and/or on semiconductor substrate 20. Wafer 100 may further include Inter-Layer Dielectric (ILD) 22 over semiconductor substrate 20, and interconnect structure 24 over ILD 22. Interconnect structure 24 includes metal lines 26 and vias 28, which are formed in dielectric layers 25. The combination of metal lines at a same level is referred to a metal layer hereinafter. Accordingly, interconnect structure 24 may include a plurality of metal layers that are interconnected through vias 28. Metal lines 26 and vias 28 may be formed of copper or copper alloys, although they can also be formed of other metals. In some embodiments, dielectric layers 25 are formed of low-k dielectric materials. The dielectric constants (k values) of the low-k dielectric materials may be less than about 3.0, or less than about 2.5, for example.

Metal pad 30 is formed over interconnect structure 24, and may be electrically coupled to integrated circuit devices 21 through metal lines 26 and vias 28, wherein lines 29 is illustrated to represent the electrical coupling. Metal pad 30 may be an aluminum pad or an aluminum-copper pad, and hence is alternatively referred to as aluminum pad 30 hereinafter, although other metallic materials may be used. Passivation layer 32 is formed over interconnect structure 24. A portion of passivation layer 32 may cover the edge portions of aluminum pads 30, and a central portion of aluminum pad 30 is exposed through an opening in passivation layer 32. Passivation layer 32 may be a single layer or a composite layer, and may be formed of a non-porous material. In some embodiments, passivation layer 32 is a composite layer comprising a silicon oxide layer (not shown), and a silicon nitride layer (not shown). Passivation layer 32 may also be formed of other non-porous dielectric materials such as Un-doped Silicate Glass (USG), silicon oxynitride, and/or the like.

Figure 2:
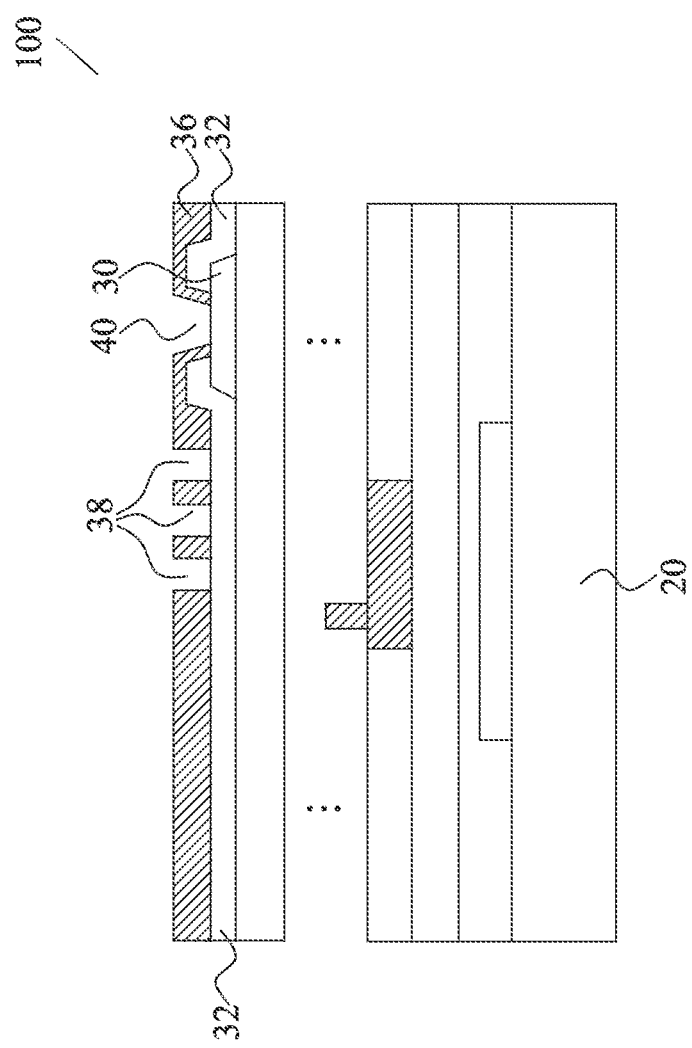

Referring to FIG. 2, polymer layer 36 is formed over passivation layer 32. Polymer layer 36 may comprise a polymer such as an epoxy, polyimide, BenzoCycloButene (BCB), PolyBenzOxazole (PBO), and the like. The formation methods may include spin coating, for example. Polymer layer 36 may be dispensed in a liquid form, and then cured.

Polymer layer 36 is patterned to form openings 38 and 40. Opening 40 is aligned to metal pad 30, wherein metal pad 30 is exposed through 40. Openings 38 are misaligned with metal pads and the metal lines (if any) that are formed simultaneously with the formation of metal pad 30. Accordingly, passivation layer 32 is exposed through openings 38. In the embodiments that polymer layer 36 is formed of a photo-sensitive material, polymer layer 36 is patterned by exposing to light through a lithography mask (not shown). The exposed polymer layer 36 is then developed to form openings 38 and 40.

Figure 3:
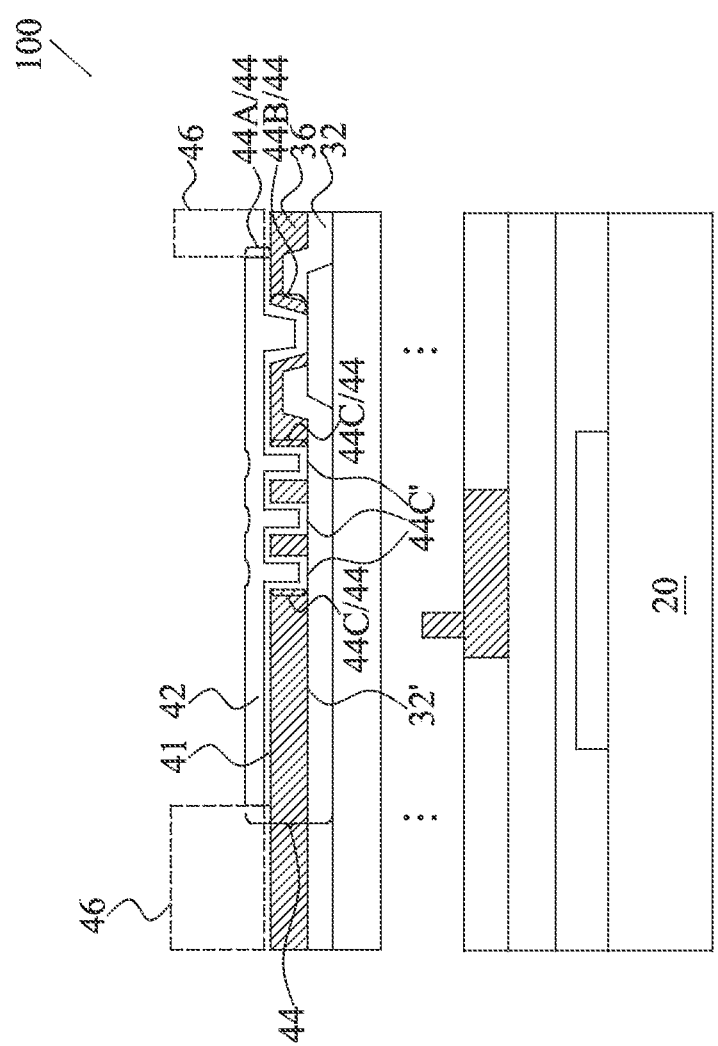

FIG. 3 illustrates the formation of PPI 44, which is such named since the formation of PPI 44 is after the formation of passivation layer 32. In some embodiments, the formation of PPI 44 includes depositing seed layer 41, forming and patterning mask 46 over seed layer 41, and then forming metal layer 42 over seed layer 41. Seed layer 41 may be a copper layer deposited using Physical Vapor Deposition (PVD). Metal layer 42 may be formed of pure copper, substantially pure copper, or a copper alloy, and may be formed using plating. Mask layer 46 may be a dry film or a photo resist. After the formation of metal layer 42, mask layer 46 is removed. The portions of seed layer 41, which portions are overlapped by mask layer 46, are then removed in an etching step.

PPI 44 includes portion 44A (also referred to as a level portion hereinafter), which is overlying polymer layer 36, and portion 44B (also referred to as a plug portion hereinafter), which acts as a via to electrically couple to metal pad 30. Furthermore, PPI 44 further includes portions 44C, which are formed in opening 38 (FIG. 2) and extending into polymer layer 36. Bottom surfaces 44C' of portions 44C are in contact with top surface 32' of passivation layer 32. In addition, bottom surfaces 44C' are not in contact with any conductive features such as the metal pads and metal lines that are in passivation layer 32. Throughout the description, portions 44C are referred to as PPI plugs. PPI plugs 44C and the overlying portion 44A are formed of a same material, and are formed in a same formation step. Accordingly, no visible interface is located between PPI plugs 44C and the overlying portion 44A.

Figure 4A:
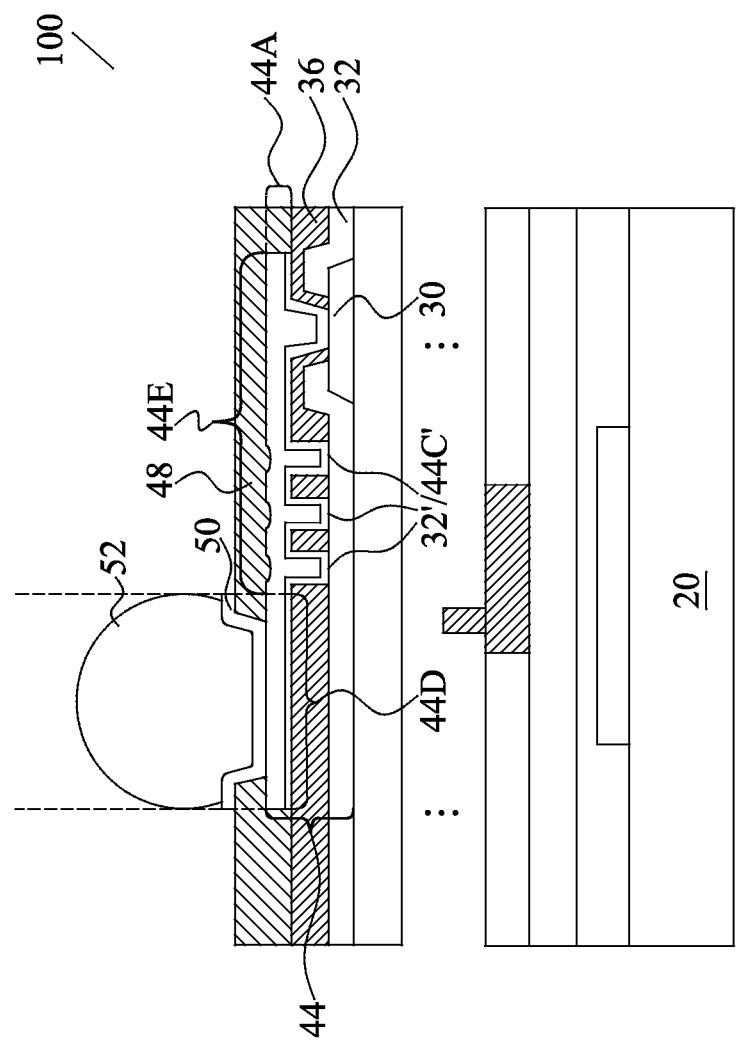

FIG. 4A illustrates the formation and patterning of polymer layer 48 and Under-Bump-Metallurgy (UBM) layer 50. Polymer layer 48 may comprise polyimide or another polymer-based material such as PBO, BCB, an epoxy, or the like. In some embodiments, polymer layer 48 is formed using spin coating.

Next, UBM layer 50 is formed. In some embodiments, UBM layer 50 includes a barrier layer and seed layer (not shown) over the barrier layer. UBM layer 50 extends into the opening in polymer layer 48, and is electrically coupled to, and may be in physical contact with, PPI 44. The barrier layer may be a titanium layer, a titanium nitride layer, a tantalum layer, a tantalum nitride layer, or layers formed of a titanium alloy or a tantalum alloy. The materials of the seed layer may include copper or copper alloys. In some embodiments, UBM layer 50 is formed using PVD or other applicable methods.

Further referring to FIG. 4A, connector 52 is formed. In some embodiments, connector 52 is a metal region, which is either a metal ball, such as a solder ball or a copper ball, placed on UBM layer 50, or a metal pillar formed on UBM layer 50 through plating. The metal region may then go through a reflow process, and metal ball 52 is formed. In alternative embodiments, connector 52 comprises a metal pillar, which may be a copper pillar. Additional layers such as a nickel layer, a solder cap, a palladium layer, and the like, may also be formed on the metal pillar.

PPI portion 44A includes portion 44D that is overlapped by UBM layer 50 and connector 52, and portion 44E, which is not overlapped by UBM 50 and connector 52. In some embodiments, PPI plugs 44C are formed under portion 44E, while under portion 44D, there is no PPI plug formed. In alternative embodiments, PPI plugs 44C are formed under both portions 44D and 44E.

Figure 4B:
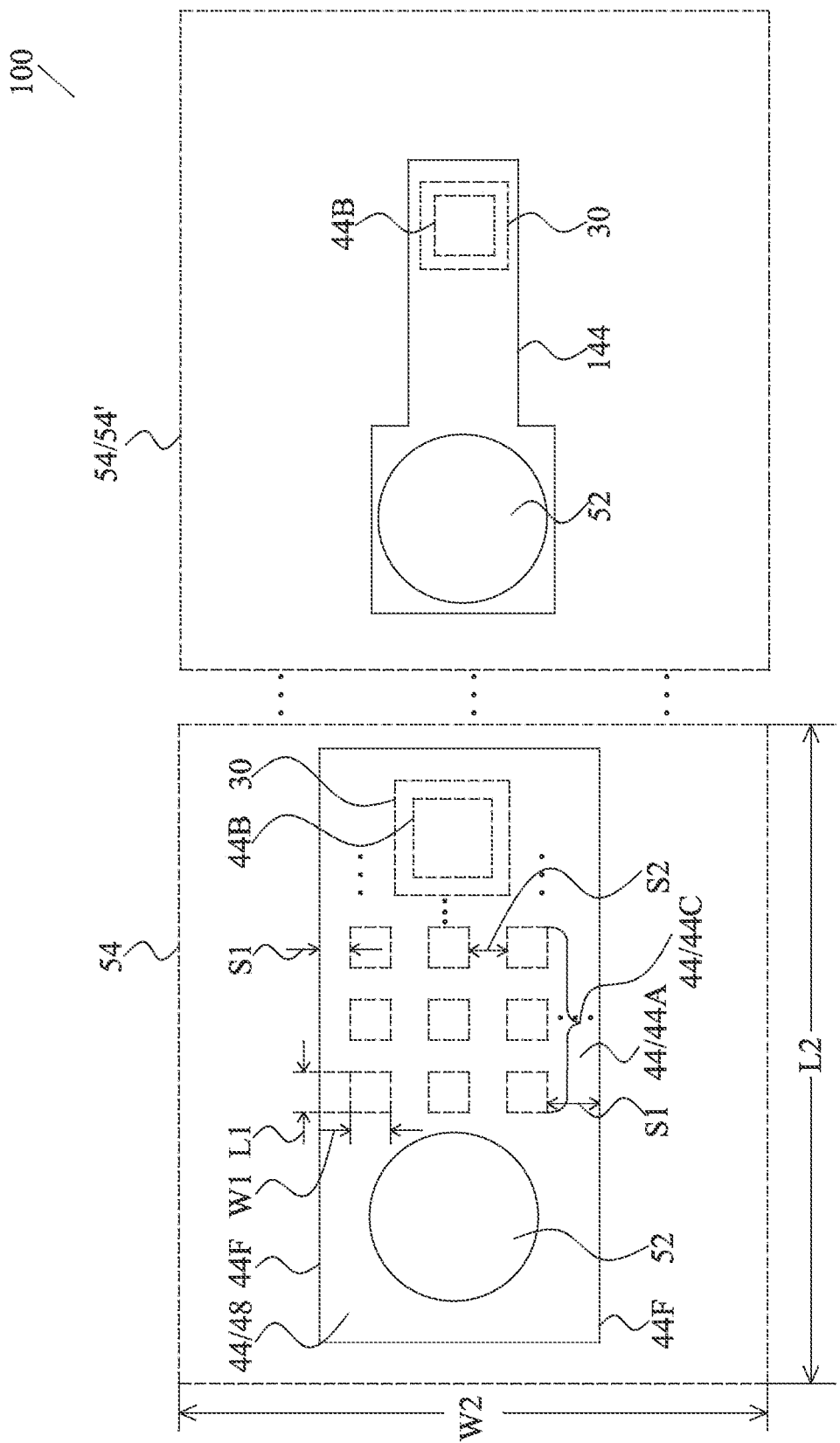
FIG. 4B illustrates a top view of the structure shown in FIG. 4A.

FIG. 4B illustrates a top view of the structure shown in FIG. 4D, wherein PPI 44, connector 52, and metal pad 30 are schematically illustrated in accordance with exemplary embodiments. PPI plugs 44C may be arranged as an array or having any other applicable layouts such as a beehive layout. The top-view shapes of PPI plugs 44C may be strips, squares, circles, hexagons, octagons, or the like. In some embodiments, PPI plugs 44C are spaced apart from the closest edges 44F of PPI 44 by spacing S1, which is greater than about 5 μm, or greater than about 10 μm. The spacing S2 between neighboring PPI plugs 44C may be greater than about 5 μm, or greater than about 10 μm. PPI plugs 44C may have lateral dimensions (such as length L1 and width W1) between about 2 μm and about 40 μm, or between about 5 μm and about 20 μm. It is appreciated, however, that the values recited throughout the description are merely examples, and may be changed to different values.

In a same chip or a same wafer, some of PPIs (such as PPI 44) may include PPI plugs, while some other PPIs (such as 144) may not include PPI plugs. In some embodiments, whether to form PPI plugs for a PPI is determined by the local pattern density of the PPIs. The local pattern density is calculated as the total top-view area of all PPIs in a local chip region 54 divided by the top-view area of the local chip region 54. For example, local chip region 54 may have length L2 and width W2 equal to or greater than about 125 μm, although different sizes may also be specified to define the sizes of local regions. For example, length L2 and width W2 may have values between about 50 μm and about 500 μm. When the local pattern density is greater than a pre-determined threshold pattern density, for example, about 60 percent, PPI plugs 44C need to be formed in the PPIs in the respective local chip regions. Otherwise, if the local pattern density of the PPIs is lower than the pre-determined threshold pattern density, the PPI plugs may be, or may not be, formed as parts of the PPIs in the respective local chip region. For example, the PPIs in local chip region 54 in FIG. 4 have a low pattern density, and hence no PPI plugs are formed therein.

Equation 1 is provided below to specify the condition that PPI plugs are to be formed:

$$A_{PPI}/A_{local} > P_{th} \quad \text{[Eq. 1]}$$

Wherein $A_{PPI}$ is a total area of PPIs in a local chip region 54, $A_{local}$ is the total chip area of the local chip region 54, and $P_{th}$ is the pre-determined threshold pattern density of the PPIs in local chip region 54. The minimum sizes of local chip regions 54 and the pre-determined threshold pattern density are determined in accordance with design rules.

When PPI plugs 44C are formed in the respective local chip region 54, the following relationship may also exist:

$$(A_{PPI} - A_{plug})/A_{local} <= P\text{th} \quad \text{[Eq. 2]}$$

wherein $A_{plug}$ is the total area of all PPI plugs 44C in the respective local chip region 54. Equation 2 indicates that the total top-view area of PPI plugs 44C is selected to compensate for the overly high pattern density of PPIs in local chip regions. Accordingly, the higher the pattern density of PPIs, the more (and/or the larger) PPI plugs 44C are formed.

FIGS. 5 through 7A illustrate cross-sectional views of intermediate stages in the formation of a post-passivation structure in accordance with alternative embodiments. Unless specified otherwise, the materials and formation methods of the components in these embodiments are essentially the same as the like components, which are denoted by like reference numerals in the embodiments shown in FIGS. 1 through 4B. The details regarding the formation process, the materials, and the values of the components shown in FIGS. 5 through 7B may thus be found in the discussion of the embodiment shown in FIGS. 1 through 4B.

Figure 5:
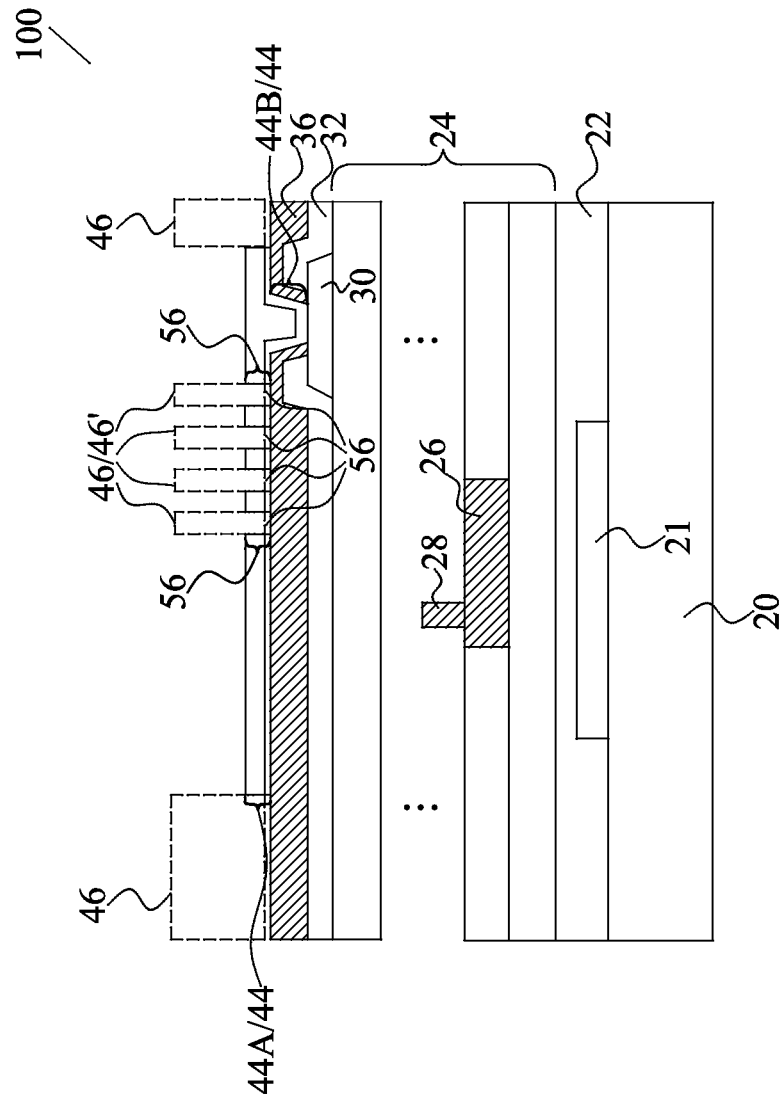
Figure 6:
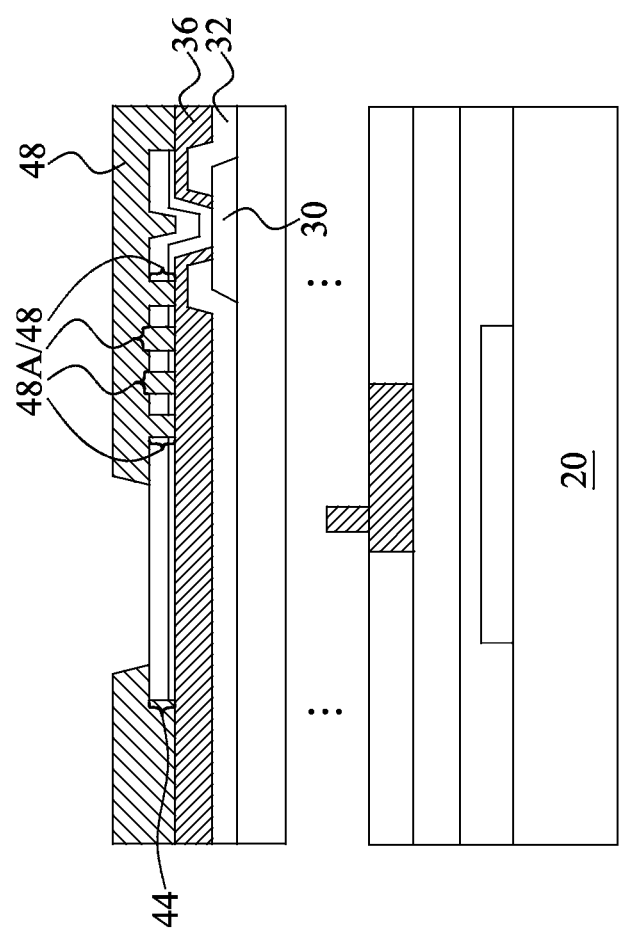
Figure 7A:
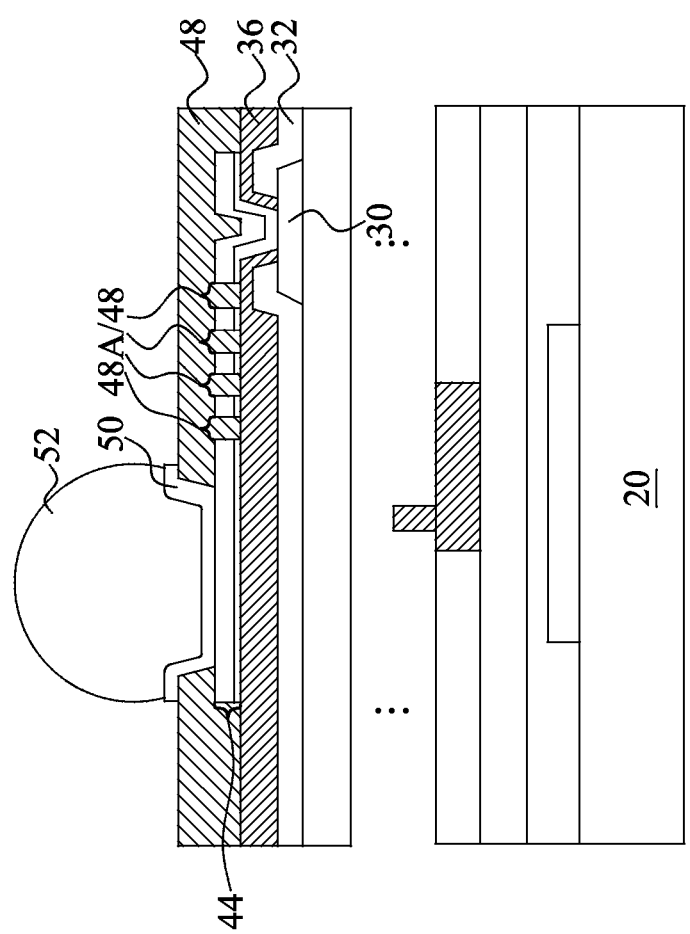

Referring to FIG. 5, an initial structure is formed. This structure is similar to the structure in FIG. 3, except that no PPI plugs 44C are formed in polymer layer 36. Instead, openings 56 are formed in PPI 44. The formation of PPI 44 is similar to the embodiment shown in FIG. 3, except that mask layer 46 also includes additional portions 46', which define the size and the locations of openings 56. Next, as shown in FIG. 6, polymer layer 48 is formed. Polymer layer 48 includes portions 48A (alternatively referred to as plugs portions hereinafter), which extend into openings 56 (FIG. 5). Portions 48A of polymer 48 are referred to as polymer plugs 48A. Polymer plugs 48 and the overlying portions (alternatively referred to as level portions) of polymer 48A are formed of a same material, and in a same formation step. Accordingly, no visible interface is located between polymer plugs 48A and the overlying portion. Next, referring to FIG. 7A, UBM 50 and connectors 52 are formed.

FIG. 7B illustrates a top view of the structure shown in FIG. 4D, wherein PPI 44, connector 52, and metal pad 30 are illustrated in accordance with exemplary embodiments. Polymer plugs 48A may be arranged as an array or having any other applicable layouts such as a beehive layout. The top view shapes of polymer plugs 48A may be strips, squares, circles, hexagons, octagons, or the like. In some embodiments, polymer plugs 48A are spaced apart from the closest edges 44F of PPI 44 by spacing S1, which may be greater than about 5 μm, or greater than about 10 μm. The spacing S2 between neighboring polymer plugs 48A may be greater than about 5 μm, or greater than about 10 μm. The lateral dimensions, such as length L1 and width W1, of polymer plugs 48A may be between about 2 μm and about 40 μm, or between about 5 μm and about 20 μm.

Similar to the formation of PPI plugs 44C, whether to form polymer plugs 48A in a PPI may be determined by the local pattern density of PPIs. For example, when the local pattern density of PPIs in local chip region 54 is greater than the pre-determined threshold pattern density, then openings 56 (FIG. 6) are formed in the PPIs in the local chip region 54 to bring down the local pattern density below the pre-determined threshold pattern density. Otherwise, if the local pattern density of the PPIs in a local chip region is lower than the pre-determined threshold pattern density, the polymer plugs may be, or may not be, formed in the PPIs in the respective local chip region.

In the embodiments, the PPI plugs and/or the polymer plugs are used to reduce the delamination between PPIs 44 (FIGS. 4A and 7A) and polymer layer 36 and 48. Since there is a significant mismatch between the Coefficient of Thermal Expansion (CTE) of PPIs 44 and the CTEs of polymer layers 36 and 48, after the reliability test, which includes a plurality of thermal cycles performed between about −40° C. and 125° C., the delamination may occur. In the embodiments, however, by forming the PPI plugs and/or the polymer plugs, the delamination is reduced.

In accordance with embodiments, a device includes device includes a metal pad, a passivation layer overlapping edge portions of the metal pad, and a first polymer layer over the passivation layer. A Post-Passivation-Interconnect (PPI) has a level portion overlying the first polymer layer, and a plug portion that has a top connected to the level portion. The plug portion extends into the first polymer layer. A bottom surface of the plug portion is in contact with a dielectric material. A second polymer layer is overlying the first polymer layer.

In accordance with other embodiments, a device includes a metal pad, a passivation layer overlapping edge portions of the metal pad, and a first polymer layer overlying the passivation layer. A PPI includes a level portion overlying the first polymer layer, a plurality of plug portions underlying the first portion and extending into the first polymer layer, wherein bottom surfaces of the plug portions are in contact with the passivation layer, and a third portion electrically coupling the level portion to the metal pad. A second polymer layer is over the first polymer layer. A UBM extends into the second polymer layer to electrically couple to the PPI. A solder-containing connector is over the UBM and electrically coupled to the metal pad through the PPI. The plug portions may be vertically misaligned with the UBM.

In accordance with yet other embodiments, a device includes a metal pad, a passivation layer comprising portions overlapping edge portions of the metal pad, and a first polymer layer over the metal pad. A PPI includes a first portion overlying the first polymer layer, and a second portion underlying the first portion and electrically coupling the first portion to the metal pad. A second polymer layer includes a level portion over the PPI, and a plug portion extending into, and encircled by, the PPI. A bottom surface of the polymer plug may be in contact with a top surface of the first polymer layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the present disclosure.

What is claimed is:

1. A device comprising:
    a dielectric layer;
    a conductive feature over and in contact with a top surface of the dielectric layer, wherein the conductive feature comprises:
        an inner edge forming a first full edge ring with no break therein; and
        an outer edge forming a second full edge ring with no break therein; and
    a polymer layer comprising:
        a first portion overlying a first portion of the conductive feature;
        a second portion penetrating through the conductive feature to contact the top surface of the dielectric layer, wherein the second portion of the polymer layer is encircled by the conductive feature, and an entirety of the first full edge ring is in contact with the second portion of the polymer layer; and
        a bulk portion at a same level as the conductive feature, wherein the second portion and the bulk portion are separated from each other, and are not connected through portions of the polymer layer that are substantially coplanar with the conductive feature, and an entirety of the second full edge ring is in contact with the bulk portion of the polymer layer.

2. The device of claim 1, wherein the dielectric layer comprises a polymer.

3. The device of claim 1, wherein the polymer layer further comprises a plurality of plug portions penetrating through the conductive feature to contact the top surface of the dielectric layer, wherein each of the plurality of plug portions of the polymer layer is encircled by the conductive feature.

4. The device of claim 3, wherein the plurality of plug portions forms an array.

5. The device of claim 1 further comprising:
an Under-Bump-Metallurgy (UBM) extending into the polymer layer to contact a pad portion of the conductive feature; and
an electrical connector overlying the UBM.

6. The device of claim 5, wherein the second portion of the polymer layer is offset from the UBM.

7. The device of claim 1, wherein the conductive feature further comprising a via portion penetrating through the dielectric layer to contact a metal pad.

8. A device comprising:
a metal pad;
a passivation layer comprising portions overlapping edge portions of the metal pad;
a first polymer layer over the metal pad;
a Post-Passivation-Interconnect (PPI) comprising:
a first portion overlying the first polymer layer; and
a second portion extending into the first polymer layer and electrically coupling the first portion to the metal pad; and
a second polymer layer comprising:
a level portion over the PPI;
a polymer plug portion (polymer plug) extending into, and encircled by, the PPI, wherein all edges of the polymer plug are in contact with the PPI, and the polymer plug does not encircle any part of the PPI; and
a plurality of polymer plug portions extending into the PPI, wherein each of the plurality of polymer plug portions is encircled by the PPI, and wherein bottom surfaces of the plurality of polymer plug portions are in contact with a top surface of the first polymer layer.

9. The device of claim 8, wherein a bottom surface of the polymer plug portion is in contact with a top surface of the first polymer layer.

10. The device of claim 8 further comprising:
an Under-Bump-Metallurgy (UBM) extending into the second polymer layer to electrically couple to the PPI; and
an electrical connector overlying the UBM.

11. The device of claim 10, wherein the polymer plug is misaligned with the UBM.

12. The device of claim 10, wherein the second polymer layer is free from polymer plug portions that are in the PPI and overlapped by the UBM.

13. The device of claim 8 further comprising:
a semiconductor substrate; and
an integrated circuit at a surface of the semiconductor substrate, wherein the metal pad is electrically coupled to the integrated circuit.

14. The device of claim 8, wherein the polymer plug comprises polyimide or PolyBenzOxazole (PBO).

15. A device comprising:
a first metal pad and a second metal pad separated from each other;
a passivation layer comprising portions overlapping edge portions of the first metal pad and the second metal pad;
a first polymer layer over the first metal pad and the second metal pad;
a first Post-Passivation-Interconnect (PPI) comprising:
a first portion overlying the first polymer layer; and
a second portion electrically coupling the first portion to the first metal pad;
a second PPI comprising:
a third portion overlying the first polymer layer; and
a fourth portion electrically coupling the third portion to the second metal pad; and
a second polymer layer comprising:
a level portion over the PPI; and
a polymer plug portion (polymer plug) extending into, and encircled by, the first PPI, wherein the first PPI comprises an inner edge forming a first full ring contacting the polymer plug, and an outer edge forming a second full ring disconnected from the first full ring, wherein an entire third portion of the second PPI is a solid pad free from openings therein.

16. The device of claim 15, wherein the second polymer layer does not extend into the third portion of the second PPI.

17. The device of claim 15, wherein the first PPI and the second PPI are in a first local device region and a second local device region, respectively, with each of the first and the second local device region having a length and a width greater than about 125 μm, and a first density of all PPIs in the first local device region is greater than a second density of all PPIs in the second local device region, with the first density calculated including areas of all polymer plugs in all PPIs in the first local device region.

18. The device of claim 15 further comprising:
an Under-Bump-Metallurgy (UBM) extending into the second polymer layer to electrically couple to the first PPI; and
a solder region overlying the UBM.

19. The device of claim 18, wherein the polymer plug is misaligned with the UBM.

20. The device of claim 15, wherein the polymer plug comprises polyimide or PolyBenzOxazole (PBO).

* * * * *